United States Patent
Illek

(10) Patent No.: US 8,378,371 B2
(45) Date of Patent: Feb. 19, 2013

(54) OPTOELECTRONIC SEMICONDUCTOR CHIP

(75) Inventor: Stefan Illek, Donaustauf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 12/298,750

(22) PCT Filed: Mar. 26, 2007

(86) PCT No.: PCT/DE2007/000554
§ 371 (c)(1),
(2), (4) Date: Mar. 5, 2009

(87) PCT Pub. No.: WO2007/124708
PCT Pub. Date: Nov. 8, 2007

(65) Prior Publication Data
US 2010/0019268 A1 Jan. 28, 2010

(30) Foreign Application Priority Data

Apr. 27, 2006 (DE) .......................... 10 2006 019 725
Jul. 27, 2006 (DE) .......................... 10 2006 034 847

(51) Int. Cl.
*H01L 33/00* (2010.01)
(52) U.S. Cl. .................... 257/99; 257/103; 257/E33.066
(58) Field of Classification Search ............ 257/80–103, 257/E33.066
See application file for complete search history.

(56) References Cited

U.S. PATENT DOCUMENTS

| 5,789,768 | A | * | 8/1998 | Lee et al. .................... 257/96 |
| 6,057,562 | A |   | 5/2000 | Lee et al. |

(Continued)

FOREIGN PATENT DOCUMENTS

| DE | 103 46 605 | 3/2005 |
| DE | 103 46 606 | 3/2005 |

(Continued)

OTHER PUBLICATIONS

Plummer, Silicon VLSI Technology, 2000, Prentice Hall, pp. 17-18.*

(Continued)

*Primary Examiner* — Tucker Wright
(74) *Attorney, Agent, or Firm* — Cozen O'Connor

(57) ABSTRACT

An optoelectronic semiconductor chip (1) is specified having a semiconductor body (2) which comprises a semiconductor layer sequence and an active area which is suitable for radiation production, and having a radiation-permeable and electrically conductive contact layer (6) which is arranged on the semiconductor body and is electrically conductively connected to the active area, with the contact layer extending over a barrier layer (5) in the semiconductor layer sequence and over a connecting layer (4) in the semiconductor layer sequence, and with the contact layer being electrically conductively connected to the active area via a connecting area (7) of the connecting layer. A method is also specified for producing a contact structure for an optoelectronic semiconductor chip which is suitable for radiation production.

16 Claims, 4 Drawing Sheets

U.S. PATENT DOCUMENTS

| | | |
|---|---|---|
| 6,350,997 B1 | 2/2002 | Saeki |
| 7,283,577 B2 | 10/2007 | Schmid et al. |
| 2001/0011730 A1 | 8/2001 | Saeki |
| 2001/0050530 A1 | 12/2001 | Murakami et al. |
| 2003/0164503 A1 | 9/2003 | Chen |
| 2004/0135166 A1* | 7/2004 | Yamada et al. ............... 257/103 |
| 2004/0140474 A1 | 7/2004 | Ueda et al. |
| 2005/0077537 A1 | 4/2005 | Seong et al. |
| 2005/0161679 A1* | 7/2005 | Sun ............................... 257/79 |
| 2005/0205875 A1 | 9/2005 | Shei et al. |
| 2006/0124945 A1 | 6/2006 | Baur et al. |
| 2007/0278508 A1 | 12/2007 | Baur et al. |

FOREIGN PATENT DOCUMENTS

| | | |
|---|---|---|
| DE | 10 2004 021 175 | 11/2005 |
| DE | 10 2004 057 802 | 6/2006 |
| DE | 20 2006 003 360 | 7/2006 |
| EP | 1 523 047 | 4/2005 |
| JP | 1-117220 | 5/1989 |
| JP | 07-015038 | 1/1995 |
| JP | 11-307810 | 5/1999 |
| JP | 2004-088083 | 3/2004 |
| JP | 2005-117040 | 4/2005 |
| JP | 2005-123409 | 5/2005 |
| JP | 2007-059623 | 3/2007 |
| WO | WO 02/45217 | 6/2002 |
| WO | WO 2004/032248 | 4/2004 |
| WO | WO 2005/024961 | 3/2005 |
| WO | WO 2005/071763 | 8/2005 |
| WO | WO 2005/117147 | 12/2005 |

OTHER PUBLICATIONS

I. Schnitzer et al, "30% external quantum efficiency from surface textured, thin-film light-emitting diodes", Appl. Phys. Lett., vol. 63, No. 16, pp. 2174-2176, Oct. 18, 1993.

* cited by examiner

OPTOELECTRONIC SEMICONDUCTOR CHIP

RELATED APPLICATIONS

This is a U.S. national stage under 35 USC §371 of application No. PCT/DE2007/000554, filed on Mar. 26, 2007.

This application claims the priority of German application no. 10 2006 019 725.9 filed Apr. 27, 2006 and DE 10 2006 034 847.8 filed Jul. 27, 2006, the entire content of both of which is hereby incorporated by reference.

BACKGROUND OF THE INVENTION

The present invention relates to an optoelectronic semiconductor chip.

SUMMARY OF THE INVENTION

One object of the present invention is to provide a radiation-emitting semiconductor chip with a high output efficiency and which can be produced more easily. Another object is to provide a surface-radiating semiconductor chip which emits the majority of the entire radiation power output from the chip, via an upper face of the chip. Another object is to provide a simplified method for producing a contact structure for an optoelectronic semiconductor chip which is suitable for radiation production and has a high output efficiency.

One object of the present invention is to specify a radiation-emitting semiconductor chip with a high output efficiency and which can be produced more easily. One particular aim is to specify a surface-radiating semiconductor chip which emits the majority of the entire radiation power output from the chip, via an upper face of the chip. A further aim is to specify a simplified method for producing a contact structure for an optoelectronic semiconductor chip which is suitable for radiation production and has a high output efficiency.

In this case, the expression "upper face" should preferably be understood as meaning a side of the semiconductor chip which faces away from a mounting side of the semiconductor chip for mounting the chip on an external connecting conductor.

This and other objects are attained in accordance with one aspect of the present invention directed to an optoelectronic semiconductor chip that has a semiconductor body which comprises a semiconductor layer sequence and an active area which is suitable for radiation production. The semiconductor chip furthermore has a radiation-permeable and electrically conductive contact layer which is arranged on the semiconductor body and is electrically conductively connected to the active area. This contact layer extends over a barrier layer in the semiconductor layer sequence and over a connecting layer in the semiconductor layer sequence. In this case, the contact layer is electrically conductively connected to the active area via a connecting area of the connecting layer.

In comparison to a highly absorbent contact layer, for example a thick metal layer, the radiation-permeable contact layer has a higher transmission coefficient, preferably a higher transmission, for radiation which is produced in the active area. The radiation power which can be output from the semiconductor chip and which radiates through the contact layer is increased, in consequence.

Furthermore, the radiation-permeable and electrically conductive contact layer can be used more easily for current spreading, compared with a metallic contact layer. Current can be distributed homogeneously in the contact layer over a lateral main extent direction of the semiconductor body, and can be applied particularly uniformly to the semiconductor body, since there is no need to provide openings in the contact layer for the radiation to pass through. In particular, the contact layer may be a layer without any cutouts, that is to say a continuous layer without any interruptions.

While charge carriers can be injected towards the active area via the connecting area of the connecting layer, the barrier layer is preferably designed such that charge carrier injection by means of the contact layer to the active area via the barrier layer is reduced in comparison to injection of charge carriers via the connecting layer by means of the contact layer.

The contact layer preferably adjoins the barrier layer in a barrier area, and/or adjoins the connecting layer in the connecting area. In particular, the barrier layer and the connecting layer can limit the semiconductor body on the side facing the contact layer. The barrier area is preferably formed by the direct contact area of the contact layer with the barrier layer. The connecting area is preferably formed by the direct contact area of the contact layer with the connecting layer.

In such a semiconductor chip, current can therefore be injected into the semiconductor body in places via the connecting area, while charge carrier injection via the barrier layer is greatly reduced in comparison to injection via the connecting area.

Deliberate charge carrier injection into the semiconductor body can therefore be achieved in predetermined areas by means of a contact structure which comprises the contact layer, the connecting layer and the barrier layer. These areas can be defined solely by means of the barrier area of the barrier layer and of the connecting area of the connecting layer, which expediently have different electrical contact characteristics to the contact layer. There is advantageously no need for additional measures for definition of a connecting area, such as an electrically insulating layer, for example a silicon-nitride layer, which is therefore not part of the semiconductor body, arranged between the semiconductor body and the contact layer and opened in places for electrical contact formation to the semiconductor body.

It should be noted that a contact structure with a contact layer which forms both a barrier area and a connecting area to a semiconductor body also in its own right represents a separate invention.

In a preferred refinement, the barrier layer and the connecting layer are designed such that a barrier for charge carrier injection into the semiconductor body by means of the contact layer via the barrier layer is greater than the barrier for charge carrier injection into the semiconductor body by means of the contact layer via the connecting layer. In particular, the barrier layer and the connecting layer are expediently formed in this way with respect to one contact layer from a predetermined material or from a predetermined material composite.

By way of example, in this case, the electrical contact resistance of the contact layer to the connecting layer is less than the electrical contact resistance of the contact layer to the barrier layer. Charge carrier injection into the semiconductor body via the barrier layer can thus be reduced particularly efficiently, while charge carrier injection via the connecting layer is at the same time correspondingly increased.

In a further preferred refinement, the connecting layer and the barrier layer are formed differently, and in particular are formed as separate layers of the semiconductor layer sequence. Different electrical contact characteristics of the connecting layer and of the barrier layer to the contact layer can thus be achieved more easily. The connecting layer and the barrier layer may have a different composition. The connecting layer and the barrier layer preferably contain different semiconductor materials, in particular different III-V semiconductor materials, or are based on different materials. The connecting layer and the barrier layer particularly preferably contain semiconductor materials from different semiconductor material systems, in particular different III-V semiconductor material systems, or are based on different material systems.

III-V compound semiconductor materials, such as nitride compound semiconductors, phosphide compound semiconductors or arsenide compound semiconductors, are particularly suitable for formation of a semiconductor layer sequence for the semiconductor body of an efficient semiconductor chip, in particular for the formation of an active area with high quantum efficiency.

If the connecting layer and the barrier layer are based on different ones of the III-V semiconductor material systems mentioned above, then the connecting layer is preferably based on a phosphide compound semiconductor material and the barrier layer is preferably based on an arsenide compound semiconductor material, or vice versa. Semiconductor layers which are based on materials from these material systems can be grown on a common growth substrate, and in particular can be grown on one another.

In the event of doubt, "based on nitride compound semiconductor material" means that at least a portion of the semiconductor layer sequence comprises a nitride/V-compound semiconductor material, preferably $Al_nGa_mIn_{l-n-m}N$, where $0 \leq n \leq 1$, $0 \leq m \leq 1$ and $n+m \leq 1$, in particular where $m \neq 0$ and/or $n \neq 0$. In this case, this material need not necessarily have a mathematically exact composition based on the above formula. In fact, it may have one or more dopants as well as additional components which do not significantly change the characteristic physical properties of the $Al_nGa_mIn_{l-n-m}N$ material. However, for the sake of simplicity, the above formula includes only the major components of the crystal lattice (Al, Ga, In, N), even if, in some cases, these can be replaced by small amounts of other substances.

In a corresponding manner, in the present case, in the event of doubt, "based on phosphide compound semiconductor material" means that at least a portion of the semiconductor layer sequence comprises a phosphide/V compound semiconductor material, preferably $Al_nGa_mIn_{l-n-m}P$, where $0 \leq n \leq 1$, $0 \leq m \leq 1$ and $n+m \leq 1$, in particular where $m \neq 0$ and/or $n \neq 0$. In this case as well, this material need not necessarily have a mathematically exact composition according to the above formula. In fact, it may have one or more dopants as well as additional components which do not significantly change the characteristic physical properties of the $Al_nGa_mIn_{l-n-m}P$ material. However, for the sake of simplicity, the above formula contains only the major components of the crystal lattice (Al, Ga, In, P), even if, in some cases, these can be replaced by small amounts of other substances.

In a likewise corresponding manner, in the present case, in the event of doubt, "based on arsenide compound semiconductor material" means that at least a portion of the semiconductor layer sequence comprises an arsenide/v compound semiconductor material, preferably $Al_nGa_mIn_{l-n-m}As$, where $0 \leq n \leq 1$, $0 \leq m \leq 1$ and $n+m \leq 1$, in particular where $m \neq 0$ and/or $n \neq 0$. In this case as well, this material need not necessarily have a mathematically exact composition according to the above formula. In fact, it may have one or more dopants as well as additional components which do not significantly change the characteristic physical properties of the $Al_nGa_mIn_{l-n-m}As$ material. However, for the sake of simplicity, the above formula contains only the major components of the crystal lattice (Al, Ga, In, As), even if, in some cases, these can be replaced by small amounts of other substances.

Nitride compound semiconductor material is particularly suitable for an active area for producing ultraviolet to blue radiation, phosphide compound semiconductor material is particularly suitable for an active area for producing yellow to red radiation, and arsenide compound semiconductor material is particularly suitable for producing infrared radiation. The semiconductor chip is preferably designed to produce visible light.

The connecting layer is based, for example, on an arsenide compound semiconductor material, and the barrier layer is based, for example, on a phosphide compound semiconductor material. These compound semiconductor materials can be monolithically integrated more easily in a common semiconductor layer sequence.

The connecting layer and the barrier layer can not only be formed by different compositions but alternatively or additionally can also be formed by other measures with different electrical contact characteristics to the contact layer. In particular, the connecting layer and the barrier layer may be based on the same material system or may even have the same material composition. Suitable measures for forming different contact characteristics will be explained in more detail further below.

In a further preferred refinement, the connecting layer is arranged between the active area and the barrier layer, in particular between the barrier area and the active area. The barrier layer in this case expediently has a cutout which preferably passes completely through this layer. The contact layer may extend through the cutout. An electrical contact, and in particular a direct contact as well, of the contact layer to the connecting layer can be produced through the cutout. The connecting area may bound the cutout of the barrier layer.

In a further preferred refinement, the barrier layer is arranged between the active area and the connecting layer, in particular between the connecting area and the active area. The connecting layer in this case expediently has a cutout through which the contact layer extends. This makes it easier to form a barrier area between the contact layer and the barrier layer. The barrier area may bound the cutout in the connecting layer.

The layer which is in each case not cut out—the connecting layer or the barrier layer—may be a continuous layer, that is to say a layer without any cutouts.

Furthermore, the barrier layer may be arranged between the contact layer and the connecting layer, or the connecting layer may be arranged between the contact layer and the barrier layer.

In a further preferred refinement, the contact layer is a layer without any cutouts. The contact layer may adjoin to the semiconductor body over the entire area. The contact layer preferably adjoins the barrier layer and the connecting layer over the entire area.

In a further preferred refinement, the connecting layer and the barrier layer are monolithically integrated in the semiconductor layer sequence. The semiconductor layer sequence with the active area, the connecting layer and the barrier layer, can thus be manufactured in a continuous process. For example, the semiconductor layer sequence with the connecting layer and the barrier layer can be grown epitaxially on a growth substrate. The connecting layer and the barrier layer can accordingly, in particular, be grown epitaxially.

The connecting layer and the barrier layer can also adjoin one another.

The contact layer is preferably applied to the prefabricated semiconductor body. For this purpose, it is particularly preferable to use a method which is not the same as the production method for the semiconductor layer sequence. A deposition method is particularly suitable for applying the contact layer.

In a further preferred refinement, the barrier layer and the connecting layer are of different conductance types (n-conductive or p-conductive, respectively). Layers of different conductance types may differ considerably in terms of the electrical contact characteristics to the contact layer, thus making it easier to form the barrier layer and the connecting layer in this way.

By way of example, the barrier layer and a semiconductor layer of the semiconductor layer sequence, which semiconductor layer is arranged on the side of the active area facing away from the barrier layer, may be of the same conductance type, for example n-conductive.

In an embodiment such as this with different conductance types, the barrier layer is preferably arranged on the side of the connecting layer facing the contact layer. Otherwise, charge carriers injected via the connecting layer would possibly have to overcome a pn junction formed by means of the barrier layer in the semiconductor body in order to be able to reach the active area. A barrier such as this for charge carriers in the semiconductor body between the connecting layer and the active area can be avoided by arranging the barrier layer on the side of the connecting layer facing away from the active area.

In a further preferred refinement, the connecting layer is doped, and the barrier layer is undoped. In this case as well, different contact characteristics can be achieved for the connecting layer and the barrier layer to the contact layer. In this case, the connecting layer may be arranged between the contact layer and the barrier layer, or the barrier layer may be arranged between the connecting layer and the contact layer. Since undoped layers generally have comparatively low conductivity, it is particularly expedient to arrange the barrier layer between the contact layer and the connecting layer, because charge carriers are carried better in the semiconductor body to the active area. Since even a comparatively thin layer with a comparatively small resistance contribution to the electrical resistance in the semiconductor body may be sufficient to form a barrier, the latter arrangement is, however, not absolutely essential.

In a further preferred refinement, the connecting layer and the barrier layer are of the same conductance type. A dopant concentration of the connecting layer is in this case preferred, in particular in the connecting area, which is greater than the dopant concentration in the barrier layer. This also makes it possible to increase the contact resistance of the contact layer to the barrier layer in comparison to the contact resistance to the connecting layer. Since the dopant concentration can have a considerably greater influence on the electrical contact formed between the contact layer and the semiconductor body than on the electrical resistance in the volume of the semiconductor body, it is possible in this case not only to arrange the connecting layer between the barrier layer and the contact layer, but also to arrange the barrier layer between the connecting layer and the contact layer. However, it is particularly expedient in this case as well to arrange the barrier layer between the connecting layer and the contact layer.

In a further preferred refinement, the dopant concentration of the connecting layer is $5*10^{15}$ $1/(cm^3)$ or more. A dopant concentration of $1*10^{16}$ $1/(cm^3)$ and in particular of $1*10^{17}$ $1/(cm^3)$ or more has been found to be particularly advantageous for the connecting layer. This is particularly advantageous for the formation of a ohmic contact between the contact layer and the connecting layer, since the formation of an ohmic contact with low barrier can be achieved more easily with higher dopant concentrations.

In a further preferred refinement, the connecting layer is p-conductive.

In a further preferred refinement, the connecting layer and the barrier layer have no modifications influencing the conductivities or the contact characteristics of the layers to the contact layer. In particular, apart from the doping or intrinsic form of the respective layer and/or different composition of the layers, these layers are preferably free of modification. The layers can therefore be produced, e.g. grown, and already have the respective contact characteristic. There is advantageously no need for subsequent measures, for example oxidation or implantation, for instance proton implantation, for definition of areas with high barriers for charge carrier injection.

The layers—the connecting layer and/or barrier layer—may each have an essentially constant conductivity in the lateral direction over their entire lateral profile.

In a further preferred refinement, the semiconductor body is formed as a thin-film semiconductor body.

For the purposes of the present application, the thin-film semiconductor body may be considered to be a semiconductor body in which the production substrate on which the semiconductor layer sequence of the semiconductor body is produced is thinned, is removed from the semiconductor layer sequence in places, or is completely removed from the semiconductor layer sequence. The production substrate may be formed by means of a substrate on which the semiconductor layer sequence is deposited. For example, the production substrate may be formed by the growth substrate on which the semiconductor layer sequence is epitaxially grown.

In one preferred refinement, the semiconductor chip comprises a mount on which the semiconductor layer sequence is arranged, and the contact layer is arranged between the semiconductor layer sequence and the mount. The mount is preferably different from the production substrate for the semiconductor layer sequence. The mount can be used to stabilize the semiconductor layer sequence mechanically. It is particularly advantageous to use a mount such as this when the semiconductor chip is being formed with a thin-film semiconductor body, since, in the case of a thin-film semiconductor body, the stabilizing effect of the production substrate is at least reduced, or is completely lacking.

Since the mount of the thin-film semiconductor body is different from the production substrate, it can be chosen comparatively freely without having to have the properties required for producing the semiconductor layer sequence, for example with regard to the crystal structure, for example the lattice constant. By way of example, the mount can be chosen to be optimized for thermal or electrical conductivity. The efficiency of the semiconductor chip can thus be increased.

The contact structure with the connecting layer, the barrier layer and the contact layer may in particular be in the form of a buried contact structure via which electrical contact can be made with the mount side of the semiconductor body.

The semiconductor layer sequence for the thin-film semiconductor body is preferably arranged on the mount before the thinning process, the removal of the substrate in places or completely, such that the mount stabilizes the semiconductor layer sequence mechanically. The risk of damage to the semiconductor layer sequence when the substrate is being handled, resulting from inadequate mechanical stability, is thus reduced.

The mount is particularly preferably arranged on the side of the semiconductor layer sequence facing away from the production substrate. Furthermore, an intermediate mount can also be arranged in such a manner and, after removal of the production substrate, the mount can be applied to the side of the semiconductor layer sequence facing away from the intermediate mount, that is to say the side on which the production substrate was arranged. The intermediate mount can then be removed.

In a further preferred refinement, a mirror layer is arranged on the side of the contact layer facing away from the active area. The mirror layer is preferably electrically conductive, and the mirror layer is particularly preferably electrically conductively connected to the contact layer.

The mirror layer is expediently designed to be reflecting for the radiation produced in the active area. The mirror layer allows radiation which passes through the radiation-permeable contact layer and strikes the mirror layer to be reflected back again into the semiconductor body. The radiation power which is emitted from the semiconductor chip from the side of the semiconductor body facing away from the mirror layer can thus be increased.

The side of the semiconductor body facing away from the mirror layer preferably forms the upper face of the surface-radiating semiconductor chip. The mirror layer is preferably arranged on the side of the semiconductor body which faces a mounting side for mounting the semiconductor chip on an external connecting conductor.

Furthermore, the mirror layer is preferably a layer without any cutouts.

In addition, the mirror layer is preferably adjacent to the contact layer. The mirror layer can be adjacent to the contact layer over the entire area.

An electrically conductive mirror layer and the contact layer make it possible to form a reflecting contact structure with an electrical connection in places to the semiconductor body, in a particularly simple manner.

In a preferred refinement, the mirror layer contains a metal. A mirror layer containing metal is distinguished by the reflectivity advantageously having little dependency on the incidence angle of the radiation on the mirror layer. In particular, radiation which strikes the mirror layer at comparatively large angles with respect to the normal to the surface of the mirror layer can thus be reliably reflected.

The mirror layer is preferably metallic or contains an alloy which contains at least one metal. Suitable metals are, for example, gold, aluminum or silver, and suitable alloys, which preferably contain at least one of the metals mentioned above, are, for example, gold germanium or gold zinc. A mirror layer containing metal can be applied to the thin-film semiconductor body, for example by means of vapor-deposition.

Furthermore, a direct contact between the semiconductor body and the mirror layer can be avoided by means of a contact layer which is arranged over the entire area between the mirror layer and the semiconductor body. Areas of lower reflectivity can be formed in a contact area such as this between the mirror layer and the semiconductor body, since an alloy can be formed with a metallic material of the mirror layer in the contact area. This alloy may have lower reflectivity than the remaining area of the mirror layer. This can be avoided in the context of the invention.

A thin-film semiconductor chip, that is to say a semiconductor chip with a thin-film semiconductor body and a mount, may also be distinguished by at least one of the following features:

a reflective layer is applied to or formed on a main surface, facing the mount, of a radiation-producing epitaxial layer sequence and reflects at least a portion of the electromagnetic radiation produced in the epitaxial layer sequence back into it;

the epitaxial layer sequence has a thickness in the region of 20 µm or less, in particular in the region of 10 µm; and/or the epitaxial layer sequence contains at least one semiconductor layer with at least one surface which has a thorough mixing structure which, in the ideal case, leads to an approximately ergodic distribution of the light in the epitaxial layer sequence, that is to say it has a scattering behavior which is as ergodically stochastic as possible.

A fundamental principle of a thin-film light-emitting diode chip is described, for example, in I. Schnitzer et al., Appl. Phys. Lett. 63 (16), Oct. 18, 1993, 2174-2176, and its content is hereby incorporated by reference.

A connection layer can be arranged and/or formed between the contact layer and the mount in order to attach the semiconductor body to the mount for a thin-film semiconductor chip. The mirror layer is preferably arranged between the connection layer and the contact layer.

In a further preferred refinement, the barrier area covers an electrode of the semiconductor chip, which electrode is arranged on the side of the semiconductor body facing away from the barrier area. In particular, the electrode may be formed as electrode metallization. Furthermore, the electrode can be provided for wire bonding. Electrodes such as these are generally absorbent for the radiation produced in the active area. Since charge carriers are not injected, or are injected only to a very reduced extent, into the semiconductor body via the barrier area, only a comparatively small amount of radiation power is produced in the region of the active area which is covered by the electrode in the lateral direction. This makes it possible to reduce the radiation power which can be absorbed in the electrode since the radiation power which is produced underneath the electrode is reduced on account of the arrangement of the barrier area. The efficiency of the semiconductor chip, in particular the radiation power which can be decoupled from the chip, is in consequence increased.

In a further preferred refinement, the barrier area is arranged in an edge area of the semiconductor chip, in particular an edge area of the semiconductor body. The proportion of charge carriers which recombine without emitting radiation is often particularly high in the edge area of the active area, which the barrier area preferably covers in this case. The quantum efficiency of the semiconductor chip can be increased by an arrangement of the barrier area such as this.

In a further preferred refinement, the semiconductor chip has a plurality of barrier areas, with one of these barrier areas covering the electrode, which is arranged on the side of the semiconductor body facing away from the barrier area, of the semiconductor chip, and with another barrier area being arranged in the edge area of the chip. These barrier areas may be in the form of a continuous area, or separate areas. In the first case, and in contrast to the second case, any two points in the barrier area can be connected to one another, without having to leave the barrier area.

In a further preferred refinement, the semiconductor chip comprises a plurality of connecting areas. The connecting areas may be in the form of a continuous area, or separate areas. The production of radiation can be concentrated via the plurality of connecting areas on zones of the active area which are particularly favorable for outputting radiation from the semiconductor chip. In this case, by way of example, suitable zones are those which are not covered by the electrode or an electrode structure on the side of the semiconductor body facing away from the contact layer.

In a further preferred refinement, the contact layer contains a radiation-permeable and electrically conductive oxide (TCO: transparent conductive oxide), in particular a metal oxide, for example a zinc oxide, such as ZnO, an indium-tin oxide (ITO), or a tin oxide, such as $SnO_2$. Radiation-permeable and electrically conductive oxides are distinguished by high radiation permeability with high conductivity, in particular in the lateral direction, at the same time. ZnO or an ITO is particularly suitable for making electrical contact with p-conductive semiconductor materials. $SnO_2$ is particularly suitable for making contact with n-conductive semiconductor materials.

A contact layer containing TCO can be doped, thus making it possible to increase the conductivity. By way of example, Al is suitable for ZnO, or Sb is suitable for $SnO_2$, for this purpose.

Radiation-permeable and electrically conductive oxides may also be distinguished by advantageously high thermal conductivities. Thermal conductivities of dielectric layers, for example composed of SiN, which are cut out in order to form a contact between a contact layer and the semiconductor body, are in contrast generally less. The thermal resistance for heat to be dissipated from the semiconductor body can thus be reduced. In consequence, it is possible to reduce the risk of thermally caused damage to the semiconductor chip.

A comparatively thin radiation-permeable contact layer is in its own right sufficient just to make electrical contact with the semiconductor body. For example, the contact layer may have a thickness of 200 nm or less. If the contact layer has a varying thickness over its lateral profile, the minimum thickness can be used, if required, for the thickness of the contact layer.

The radiation-permeable contact layer preferably has a thickness which is greater than or equal to one quarter of the wavelength of the radiation produced in the active area in the contact layer. In mathematical terms, the thickness D of the contact layer, in particular the minimum thickness, preferably satisfies the following relationship:

$$D \geq \frac{\lambda}{4n_k} + m \cdot \frac{\lambda}{2n_k}$$

where $\lambda$ is a characteristic emission wavelength, for example the peak wavelength, the dominant wavelength or a main wavelength in the emission spectrum of the radiation produced in the active area, $n_k$ is the refractive index of the contact layer, and m=0, 1, 2, . . . .

Furthermore, the thickness D is preferably actually greater than the right-hand side of the inequality, that is to say it is not equal to the right-hand side. This advantageously makes it possible to increase the overall reflectivity of the reflective contact structure with the mirror layer and the contact layer, taking account of oblique radiation incidence. A thickness change by an integer multiple of $$\frac{\lambda}{2n_k}$$

does not significantly change the reflection characteristics of the contact structure. Therefore, preferably, m=0. The contact layer can therefore be formed in a particularly material-saving manner.

In a further preferred refinement, the connecting layer contains GaAs or AlGaAs, preferably with a low Al content. GaAs or AlGaAs, in particular with a low Al content, for example of 40% or less, is particularly suitable for making electrical contact with TCO materials, in particular with ZnO.

A semiconductor chip which in particular can be produced easily and is more efficient, in particular with an active area which contains a phosphide compound semiconductor material, can be formed by means of a contact layer which contains ZnO, and a mirror layer which contains Au.

In a further preferred refinement, the semiconductor chip is in the form of a light-emitting diode chip, for example an LED chip for production of incoherent radiation, for example an LED chip without a resonator or an RCLED chip (resonant cavity light emitting diode) with a resonator, or a laser diode chip for production of coherent radiation, for example for an edge-emitting laser, a vertically emitting laser with an internal resonator (VCSEL: vertical cavity surface emitting laser) or a vertically emitting laser with an external resonator (VECSEL: vertical external cavity surface emitting laser).

Another object of the invention is directed to a method for producing a contact structure for an optoelectronic semiconductor chip which chip is suitable for radiation production, a semiconductor layer sequence with a connecting layer and a barrier layer is produced first of all, with the barrier layer being arranged on the connecting layer.

Thereupon, in a first variant, the connecting layer can be removed in places, with the barrier layer being exposed thereby. In a complementary manner to this, in a second variant, the barrier layer can be removed in places, thereby exposing the connecting layer. For the first variant, a semiconductor layer sequence is expediently provided in which the barrier layer is arranged between the connecting layer and the active area of the semiconductor layer sequence. For the second variant, the connecting layer is expediently arranged between the barrier layer and the active area.

A radiation-permeable and electrically conductive contact layer is then applied to the semiconductor layer sequence, with the contact layer being arranged both, in particular directly, on the connecting layer and, in particular directly, on the barrier layer. The electrical contact resistance of the barrier layer to the contact layer is preferably greater than the electrical contact resistance of the contact layer to the connecting layer.

The contact layer can be deposited on the semiconductor layer sequence, in particular by means of a vacuum process. By way of example, the contact layer can be deposited by means of a PVD (physical vapor deposition) method, such as sputtering or vapor deposition, or a CVD (chemical vapor deposition) method, such as PECVD (plasma enhanced chemical vapor deposition).

In order to promote the formation of an electrical contact between the contact layer and the connecting layer, a temperature process, for example a sintering process, can be carried out after the contact layer has been applied.

Furthermore, the contact layer can be applied to the semiconductor layer sequence over the complete area. In addition, the contact layer may be in the form of an unstructured layer, that is to say for example in the form of a layer over the entire area after application, a layer which is not structured any further. There is no need to provide an electrically insulating structured layer, for example a silicon nitride layer, because of the formation of the connecting layer and the barrier layer with different electrical contact characteristics to the contact layer. It is therefore possible to save the application of the insulating layer and a structuring step, for example a photolithography step, for the insulating layer.

In one preferred refinement of the method, a mirror layer, in particular an electrically conductive mirror layer, is applied to the side of the contact layer facing away from the semiconductor layer sequence. The mirror layer is preferably deposited, for example by vapor deposition or sputtering. Furthermore, the mirror layer is preferably applied as a continuous layer, in particular over the entire area. The mirror layer can be applied using a vacuum process.

The layer assembly with the contact layer, the connecting layer and the barrier layer and, if appropriate, the mirror layer, can then be arranged on a mount for the semiconductor chip. In this case, the contact layer is expediently arranged between the mount and the semiconductor layer sequence. The mount is preferably part of the semiconductor chip for which the contact structure is intended.

A substrate, on which the semiconductor layer sequence is preferably arranged while being produced, for example the production substrate of the semiconductor layer sequence, can be thinned, removed in places or removed completely after the layer assembly has been arranged on the mount. In this case, the contact layer is expediently applied to the side of the semiconductor body facing away from the substrate.

The method is preferably carried out for producing a semiconductor chip according to the invention. Features which are described in more detail above and in the following text for the semiconductor chip can accordingly also relate to the method for producing the contact structure or for producing a semiconductor chip with a corresponding contact structure, and vice versa.

BRIEF DESCRIPTION OF THE DRAWINGS

Advantageous refinements and developments of the invention can be found in the following description of the exemplary embodiments, in conjunction with the figures.

DETAILED DESCRIPTION OF THE DRAWINGS

Identical elements, elements of the same type and elements having the same effect are provided with the same reference symbols in the figures.

Figure 1:
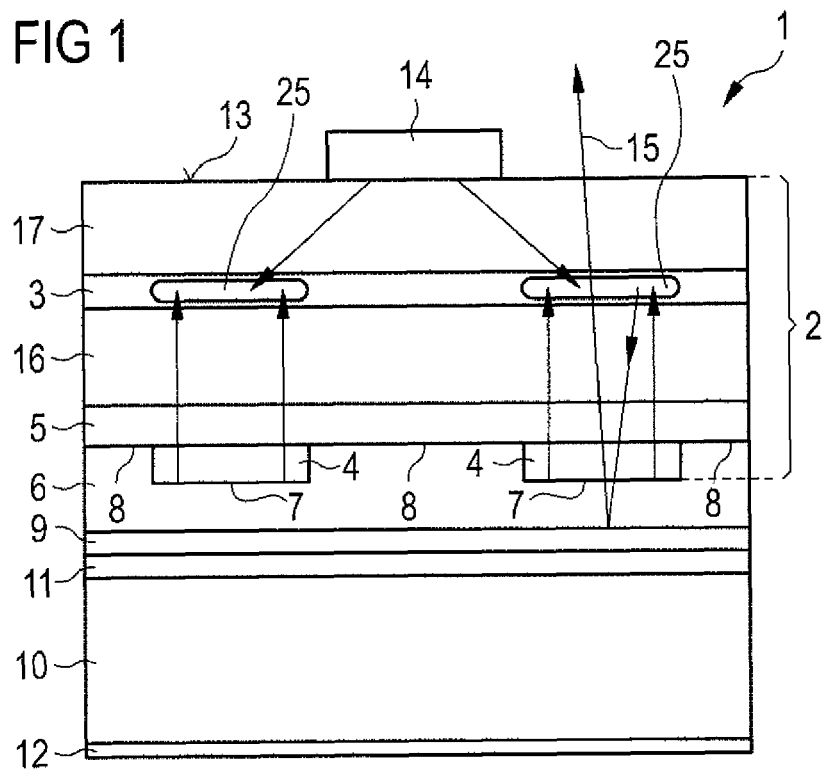
FIG. 1 shows a schematic section view of a first exemplary embodiment of an optoelectronic semiconductor chip according to the invention.
Figure 2:
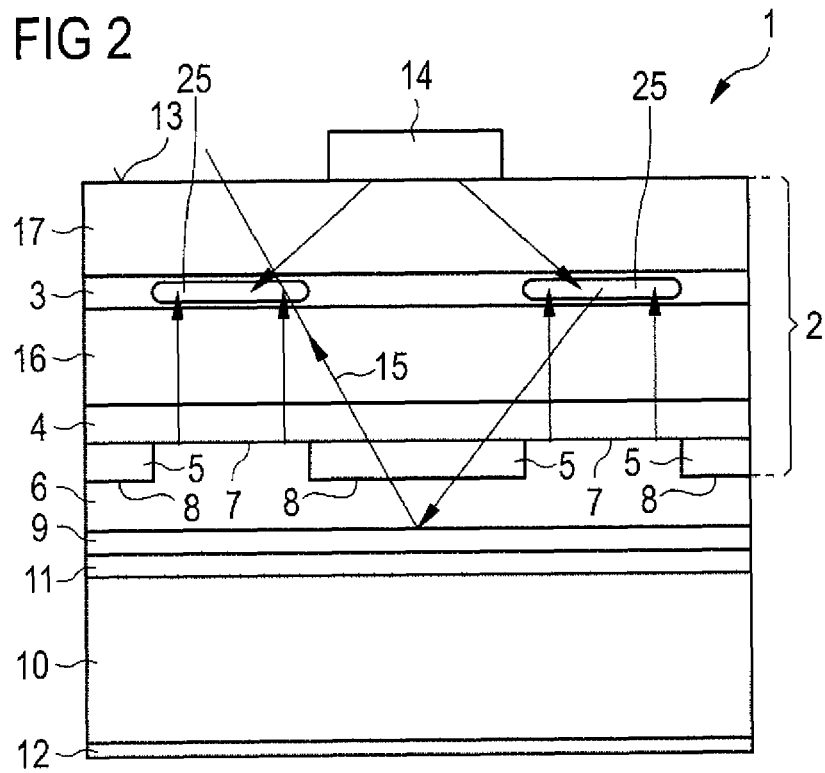
FIG. 2 shows a schematic section view of a further exemplary embodiment of a semiconductor chip according to the invention.

FIGS. 1 and 2 each show a schematic section view of one exemplary embodiment of an optoelectronic semiconductor chip 1 according to the invention, for example of an LED chip.

The semiconductor chip 1 in each case has a semiconductor body 2 which comprises a semiconductor layer sequence with an active area 3 which is suitable for radiation production. A connecting layer 4 and a barrier layer 5 are integrated in the semiconductor layer sequence, which is preferably grown epitaxially, for example by means of MOVPE (metalorganic vapor phase epitaxy) on a growth substrate (not illustrated).

A radiation-permeable and electrically conductive contact layer 6 is arranged on the semiconductor body 2 and is adjacent to the connecting layer 4 and the barrier layer 5. A connecting area 7, via which the contact layer 6 is electrically conductively connected to the active area, is formed in the direct contact area of the contact layer to the connecting layer. A barrier area 8 is formed in the direct contact area of the contact layer to the barrier layer 5.

Charge carrier injection into the semiconductor body 2 via the barrier area 8 is more difficult than charge carrier injection into the semiconductor body via the connecting area 7. The current injection in places into the semiconductor body can therefore be achieved more easily by the formation of the connecting area and of the barrier area, by means of the continuous and uninterrupted contact layer 6. There is no need for a dielectric layer between the semiconductor body 2 and the contact layer 6, which is appropriately cut out in order to form an electrical contact between the contact layer and the semiconductor body.

In one advantageous refinement, a thickness of the connecting layer and/or a thickness of the barrier layer is greater than 10 nm, preferably greater than or equal to 30 nm, and particularly preferably greater than or equal to 50 nm. Alternatively or additionally, the thickness of the barrier layer and/or the thickness of the connecting layer is advantageously less than 1000 nm, preferably less than or equal to 500 nm, and particularly preferably less than or equal to 300 nm. Thicknesses such as these are particularly suitable for the connecting layer in order to make electrical contact with the contact layer on the one hand and in order to form a barrier to the contact layer by means of the barrier layer, on the other hand.

An electrically conductive mirror layer 9 is arranged on the side of the contact layer 6 facing away from the semiconductor body 2. The mirror layer is preferably a continuous, uninterrupted layer. Furthermore, the mirror layer 9 preferably adjoins the contact layer 6, in particular over the entire area.

The contact layer 6 is advantageously continuously arranged between the mirror layer 9 and the semiconductor body 2. This makes it possible to avoid direct contact between the semiconductor material of the semiconductor body 2 and of the mirror layer 9. The risk of reflectivity-reducing formation of an alloy from the material of the mirror layer and the semiconductor material can thus be reduced. The mirror layer can therefore have a uniformly high reflectivity over its entire lateral profile, in a simplified manner.

The semiconductor body 2 is also in the form of a thin-film semiconductor body in which the growth substrate for the semiconductor layer sequence is removed from the semiconductor layer sequence in places (not illustrated) or completely.

In order to provide mechanical stability to the thin-film semiconductor body 2, it is arranged on a mount 10 which is different from the growth substrate of the semiconductor layer sequence. The semiconductor chip 1 is therefore a thin-film semiconductor chip.

A connection layer 11 is arranged between the mirror layer 9 and the mount in order to attach the thin-film semiconductor body 2 to the mount 10. The connection layer 11 and/or the mount 10 are preferably electrically conductive, as a result of which an electrical contact connection of the semiconductor chip 1 can be made through the mount 10, the connection layer 11, the mirror layer 9 and the contact layer 6.

A mounting electrode 12 is arranged on the side of the mirror layer 9 facing away from the contact layer 6, in particular on the side of the mount 10 facing away from the contact layer 6. By means of the mounting electrode 12, the semiconductor chip 1 can be arranged on an external connecting conductor, for example a connecting conductor of a surface-mountable device or the connecting conductor of a circuit board, can be electrically conductively connected thereto, and in particular be attached thereto.

An electrode 14 is arranged on an upper face 13 of the semiconductor chip 1 facing away from the contact layer 6. The electrode 14 is preferably a bonding electrode and is intended to make an electrically conductive connection to a bonding wire via which the semiconductor chip 1 can be electrically conductively connected to a further external connecting conductor. The electrode 14 and the mounting electrode 12 may each be formed as a metallization.

During operation of the chip, charge carriers are injected via the electrodes 12 and 14 into the active area 3 and can recombine there under radiation emission. Charge carriers which are injected via the electrode 14 and the contact layer 6 into the semiconductor body 2 are indicated by appropriate arrows.

The configuration and arrangement of the connecting area 7 allows the production of radiation in the active area 3 to be concentrated onto areas which are particularly suitable for this purpose. Radiation which is produced in zones of the active area 3 which are covered in the vertical direction by the electrode 14, as seen from the active area, is absorbed with an increased probability in the electrode 14. The connecting area 7 is therefore preferably at a distance from the electrode 14 in the lateral direction. The barrier area 8 expediently covers the electrode 14, in particular completely. As a more far-reaching precaution against radiation being produced underneath the electrode 14, the barrier area 8 is broadened laterally (i.e., is wider) with respect to the lateral extent of the electrode 14 in an area which is mutually covered by the electrode 14. It may be sufficient that a subregion of the barrier area is wider than the region of the electrode which covers that subregion. This largely prevents radiation from being produced underneath the electrode 14, as a result of the current spreading in the semiconductor body.

During operation of the semiconductor chip 1, the radiation production is concentrated on regions of the active area 3 which are not covered by the electrode 14; cf. the regions 25 with boundaries in FIGS. 1 and 2, in which charge carriers which are injected into the semiconductor body via the electrode 14 and the connecting area 7 recombine with radiation being produced. These regions 25 are expediently laterally separated from the electrode 14.

Radiation which runs in the direction of the contact layer 6, starting from the active area 3, can pass through the radiation-permeable contact layer and can strike the mirror layer 9. This radiation can be reflected back by means of the mirror layer 9 into the semiconductor body 2, and can be emitted from the semiconductor chip 1 via the upper face 13 of the semiconductor body 2 facing away from the mirror layer. This is indicated in the form of an example by the beam 15.

The mirror layer 9 makes it possible to reduce the absorption of radiation in elements which are arranged on the side of the mirror layer facing away from the active area 3, for example the connection layer 11 or the mount 10, while at the same time increasing the radiation power which emerges from the semiconductor body via the upper face 13.

The risk of non-radiating recombination of charge carriers is particularly high in the lateral edge area of the semiconductor body, and in particular of the active area 3. The barrier area 8 therefore covers the edge area of the active area, thus reducing charge carrier injection via the contact layer 6 into the semiconductor body 2 to the edge area of the active area. The barrier layer can, in particular, laterally limit the semiconductor body 2.

The active area 3 is arranged or formed between a first semiconductor layer 16 and a second semiconductor layer 17 which are of different conductance types (n-conductive and p-conductive, respectively). The semiconductor layers 16 and 17 are preferably cladding layers. A cladding layer can increase the enclosure of charge carriers in the active area and can therefore increase the conversion efficiency of electrical power and radiation power of the semiconductor chip.

If required, it is possible to dispense with a separate connecting layer, and the semiconductor layer 16 can be used as the connecting layer.

Overall, the invention allows for a surface-radiating thin-film semiconductor chip to be provided which, as has already been explained further above, has a contact structure which can be produced more easily for current injection in places into the semiconductor body, and has a high output efficiency.

In one preferred refinement, the semiconductor body, in particular the active area 3, the connecting layer 4, the barrier layer 5, the first semiconductor layer 16 and/or the second semiconductor layer 17 contain/contains a III-V semiconductor material. A semiconductor chip with particularly high internal quantum efficiency can be formed by means of such semiconductor materials. Furthermore, the semiconductor chip is preferably designed to produce visible radiation.

The contact layer 6 is preferably a TCO contact layer. In addition to having high radiation permeability, TCO materials are also distinguished by high electrical conductivity.

One difference between the exemplary embodiment illustrated in FIG. 1 and that illustrated in FIG. 2 is the arrangement and configuration of the connecting layer and of the barrier layer.

In the exemplary embodiment shown in FIG. 1, the barrier layer 5 is formed as a continuous layer and is arranged between the connecting layer 4 and the active area. The connecting layer 4 is cut out in places, thus allowing the contact layer to pass through the connecting layer 4 and to form the barrier area 8, by direct contact with the barrier layer 5. In contrast to this, in the exemplary embodiment shown in FIG. 2, the connecting layer 4 is formed as a continuous layer and is arranged between the barrier layer 5 and the active area. In this case, the barrier layer 5 is cut out in places in order to form the connecting area 7 by direct contact of the contact layer to the connecting layer.

The electrical contact resistance of the contact layer 6 to the barrier layer 5 is deliberately increased in both exemplary embodiments in comparison to the contact resistance of the contact layer 6 to the connecting layer 4. The connecting area 7 and the barrier area 8 are connected in parallel with the contact layer 6, as a result of which, because of the increased contact resistance, considerably fewer charge carriers are injected into the semiconductor body via the barrier layer than via the connecting layer. The connecting layer 4 and the barrier layer 5 are preferably designed differently from one another, for this purpose.

The connecting layer is preferably of the same conductance type as the first semiconductor layer 16, which is arranged between the active area and the connecting layer, for example p-conductive.

Particularly suitable refinements for some elements of the semiconductor chip are specified in the following text for a semiconductor chip 1 whose active area contains a phosphide compound semiconductor material, in particular InGaAlP.

The contact layer 6 is preferably a ZnO layer. If required, the contact layer can be doped in order to increase the conductivity. In this case, by way of example, Al is suitable for ZnO.

A p-conductive, for example Mg-doped, (Al)GaAs layer with a dopant concentration of greater than or equal to $5*10^{15}$ 1/(cm$^3$), preferably of $1*10^{16}$ 1/(cm$^3$) or more, particularly preferably of $1*10^{17}$ 1/(cm$^3$) or more, is particularly suitable for use as a connecting layer 4 for a ZnO contact layer for the semiconductor body. Since GaAs absorbs in the visible spectral range, an AlGaAs layer is particularly expedient as a connecting layer for an active area which produces visible radiation. The band gap of the AlGaAs layer can be adapted via the Al content such that absorption of radiation in the connecting layer is reduced or completely avoided. The Al content is preferably 40% or less.

An Au or AuZn mirror layer is distinguished by particularly high reflectivities for radiation which can be produced by phosphide compound semiconductor materials, in particular from the yellow into the red spectral range.

The mount 10 may contain or be composed of germanium or GaAs.

Furthermore, the thermal resistance between the mirror layer and the semiconductor body can be reduced by dispensing with a dielectric material for definition of the contact structure. By way of example, ZnO has a higher thermal conductivity (0.54 W/(Kcm)) than a silicon nitride (SiN$_x$: typically 0.1 W/(Kcm) to 0.2 W/(Kcm)). In consequence, it is possible to reduce the risk of a reduction in efficiency or damage to the semiconductor chip caused by heat accumulation. This can be observed particularly severely in a semiconductor chip in which there is no mount 10 or in which the mount is severely thinned.

In comparison to a semiconductor chip 1 with a dielectric material for definition of local electrical contact points, the thermal resistance of the chip can be reduced by up to 50%.

The connection layer 11 may be a solder layer, for example a layer containing AuSn, an electrically conductive adhesive layer or a layer which is formed by means of a wafer-bonding process.

The barrier layer 5 and the connecting layer 4 may have different materials, with the material of the contact layer 6 being better electrically connected to the material of the connecting layer 4 than to that of the barrier layer 5. For example, in the case of an arsenide-based connecting layer, such as an (Al)GaAs connecting layer, the barrier layer may contain a phosphide compound semiconductor material, for example InAlP or InGaAlP.

Furthermore, the contact resistance of the connecting layer 4 can be deliberately reduced in comparison to that of the barrier layer 5 by matching the doping levels in the connecting layer and barrier layer to one another. In this case, the connecting layer and the barrier layer may in particular have the same material composition, except for the doping. However, any difference in the contact resistance can be increased in a simplified manner by means of different material compositions.

In order to increase the contact resistance of the barrier layer 5 to the contact layer 6 in comparison to the contact resistance of the contact layer 6 to the connecting layer 4, the barrier layer can be doped for a conductance type which is different from that of the connecting layer, for example n-conductive.

The predominant charge injection into the semiconductor body via the connecting area into the semiconductor body 2 can also be achieved by doping the barrier layer 5 for the same conductance type as the connecting layer, but with a lighter dopant concentration. The barrier layer preferably has a dopant concentration of less than $5*10^{15}$ 1/(cm$^3$). If required, the same dopant may be used, or different dopants may be used for the connecting layer and the barrier layer.

As an alternative to influencing the contact resistance via the dopant concentration or the conductance type, the barrier layer can be designed to be undoped, by which means the contact resistance of the barrier layer to the contact layer can likewise be increased if the connecting layer is doped. In this case as well, the connecting layer and the barrier layer may if required have the same material composition, except for the doping. However, any difference in the contact resistance can be increased in a simplified manner by means of different material compositions.

Since the charge carriers, after being injected into the semiconductor body 2 in the exemplary embodiment as shown in FIG. 1, still have to pass through the continuous barrier layer in order to reach the active area, the barrier layer 5 in the exemplary embodiment shown in FIG. 1 is preferably undoped and is correspondingly thin, or is of the same conductance type as the connecting layer 4, but with a smaller dopant concentration. Lower dopant concentrations are generally sufficient for low-resistance charge carrier transport within the semiconductor body and for efficient, low-barrier charge carrier injection into the semiconductor body.

In order to optimize the reflectivity of the reflecting contact structure with the contact layer and the mirror layer, the contact layer preferably has a thickness which is greater than $\lambda/(4n_k)$, where $\lambda$ is a characteristic emission wavelength, for example one of the wavelengths which are mentioned further above, of the radiation which is produced in the active area and in particular the radiation which is output from the semiconductor chip. $n_k$ denotes the refractive index of the material of the contact layer. By way of example, the thickness of the contact layer is greater than 400 nm. Preferably, a minimal thickness of the contact layer is formed in this way.

In addition to the good electrical connection to the semiconductor body in the connecting area 7, it is also possible in this way for the reflective contact structure to have a reflectivity which is optimized over a wide range of incidence angles. However, even a contact layer with a thickness of less than $\lambda/(4n_k)$, for example of 200 nm or less, may be sufficient on its own for contact formation.

In a further preferred refinement, the active area has a double-heterostructure or a single or multiple quantum well structure. Structures such as these allow the quantum efficiency of the active area to be advantageously increased.

For the purposes of the application, the expression quantum well structure covers any structure in which charge carriers have or can have their energy states quantized by confinement. In particular, the expression quantum well structure does not include any indication of the dimensionality of the quantization. It therefore covers, inter alia, quantum troughs, quantum wires and quantum points and any combination of these structures.

Figure 4A:
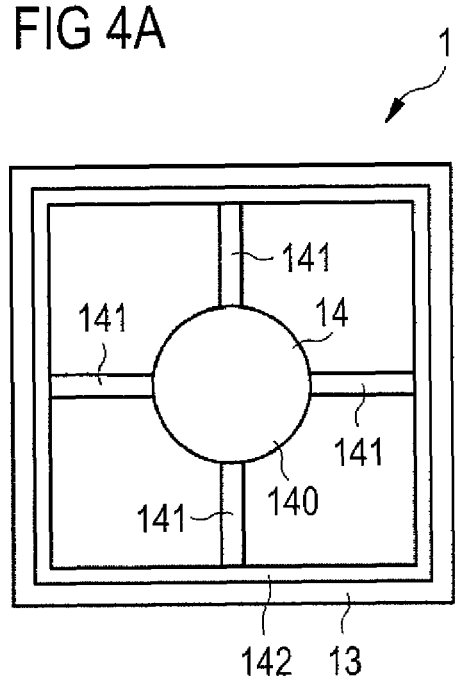
FIGS. 4A and 4B show schematic views of the upper face and lower face, respectively, of a semiconductor body for a semiconductor chip according to the invention.
Figure 4B:
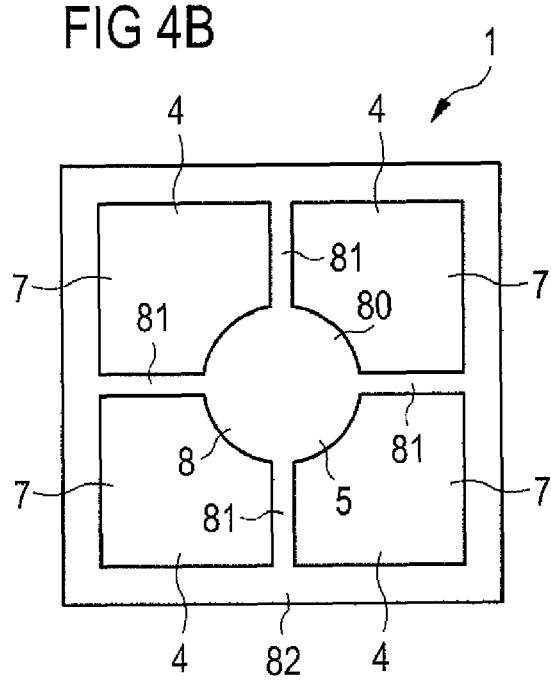

FIGS. 4A and 4B show schematic views of a semiconductor chip according to the invention, for example a chip as shown in FIG. 1 or FIG. 2. In this case, FIG. 4A shows a view of the upper face 13 of the semiconductor body 2, and FIG. 4B shows a view of the connecting layer 4 and the barrier layer 5 on the semiconductor body 2.

The electrode 14 has an electrode area 140 which is intended to be connected to a bonding wire. Webs 141 which are used for current spreading are electrically conductively connected to the area 140. The area 140 is electrically conductively connected to an electrode frame 142 by means of the webs 141. The electrode frame 142 is arranged in the edge area of the upper face 13. The electrode frame and the electrode webs are not illustrated explicitly in the section views shown in FIGS. 1 and 2.

An electrode structure such as this allows a lateral current spreading to be achieved, originating from the electrode area 140.

As can be seen from FIG. 4B, the shape of the barrier area 8 is preferably matched to that of the electrode structure shown in FIG. 4A. For this purpose, the barrier area may have a basic geometry which corresponds to the electrode structure.

According to FIG. 4B, the semiconductor chip 1 has a plurality of separate connecting areas 7 and one continuous barrier area 8, which is shaped to correspond to the electrode structure. The barrier area 8 accordingly has an area 80, originating from which webs 81 connect the area 80 to a barrier frame 82. The corresponding regions of the barrier area preferably each have a greater lateral extent than the electrode structure. The barrier area is preferably designed such that, despite current spreading in the semiconductor body, radiation production is avoided in the active area underneath the electrode structure.

Furthermore, if required, the semiconductor chip may have a plurality of separate barrier areas (not illustrated). This is particularly expedient when the aim is to suppress recombination of charge carriers in the edge area of the semiconductor body, and the electrode 14 has only the electrode area 140. A first barrier area is then preferably arranged underneath the electrode area 140, and a second barrier area, which is spatially separated from the former, is arranged in the edge area of the semiconductor body 2.

Furthermore, the connecting area, particularly when separate barrier areas are used, may be a cohesive area (not illustrated).

Figure 3:
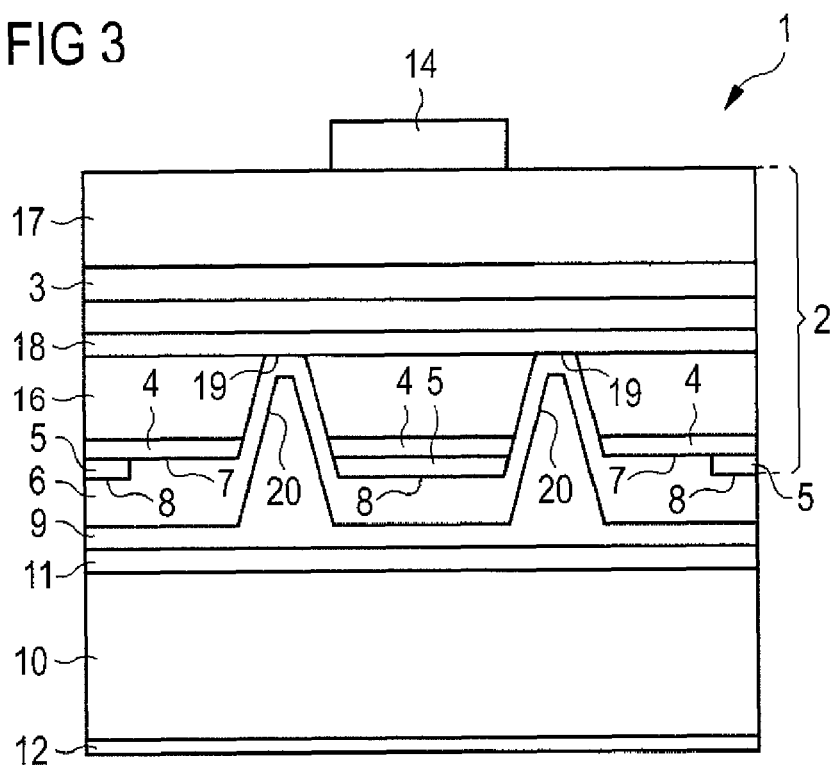
FIG. 3 shows a schematic section view of a further exemplary embodiment of an optoelectronic semiconductor chip.

FIG. 3 shows a further exemplary embodiment of an optoelectronic semiconductor chip 1 according to the invention. The semiconductor chip 1 essentially corresponds to the exemplary embodiments illustrated in FIGS. 1 and 2. In contrast to them, the semiconductor body 2 has one or more recesses 20 which extend in the direction of the active area 3, starting from the side of the semiconductor body 2 facing the contact layer 6. In particular, the recesses 20 can taper in the direction of the active area 3.

Furthermore, the recesses 20 preferably break through the connecting layer 4, the barrier layer 5 and possibly the semiconductor layer 16. The contact layer 6 extends into the recess and preferably lines it. The mirror layer 9 preferably also extends into the recess.

A further barrier layer 18, which the contact layer 6 adjoins in a further barrier area 19, is arranged between the active area 3 and the contact layer. The further barrier layer is preferably p-conductive and/or has a smaller dopant concentration, corresponding to the above explanations, than the connecting layer.

The angle distribution of radiation which is reflected back on the mirror layer into the semiconductor body with respect to the upper face 13 can be scattered more broadly in comparison to reflection on a continuously flat mirror layer, via the recess and in particular via the mirror layer arranged in it. The probability of radiation striking the upper face 13 of the semiconductor body 2 at an angle of less than a cut-off angle for total-internal reflection and thus being able to emerge from the semiconductor body is thus increased. In a corresponding manner, the proportion of the totally internally reflective radiation propagating in the semiconductor body can be reduced by means of the recess 20. This increases the output efficiency of the semiconductor chip, overall.

By way of example, the recesses 20 may be formed by means of a microprism structure. The recesses 20 may, for example, be produced by means of etching.

A plurality of separate recesses may be provided, or one continuous recess may be provided.

FIGS. 5A to 5D and 6A to 6D show, respectively, one exemplary embodiment of a method according to the invention for producing a contact structure for an optoelectronic semiconductor chip which is suitable for radiation production. The method for forming the contact structure is in this case described in conjunction with the production of a semiconductor chip according to the invention, in which case the method as shown in FIGS. 5A to 5D is suitable for a semiconductor chip as shown in FIG. 1, and the method as shown in FIGS. 6A to 6D is suitable for a semiconductor chip as shown in FIG. 2.

Figure 5A:
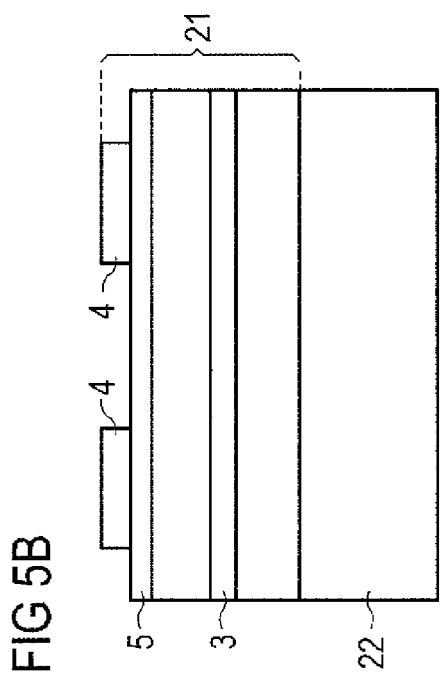
FIGS. 5A and 5D show schematic section views of intermediate steps in a first exemplary embodiment of a method according to the invention for forming a contact structure for an optoelectronic semiconductor chip.
Figure 6B:
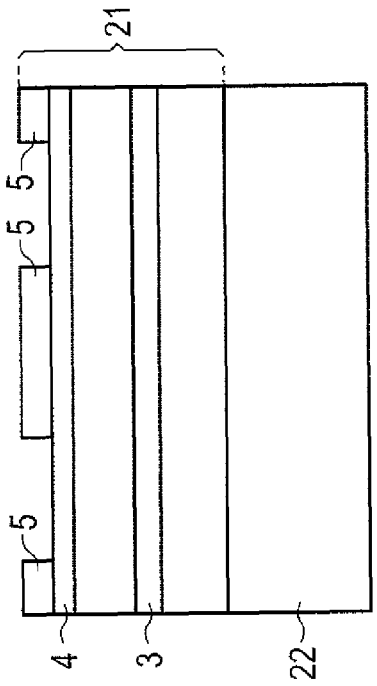
FIGS. 6A and 6D show schematic section views of intermediate steps in a further exemplary embodiment of a method according to the invention for forming a contact structure for an optoelectronic semiconductor chip.
Figure 6A:
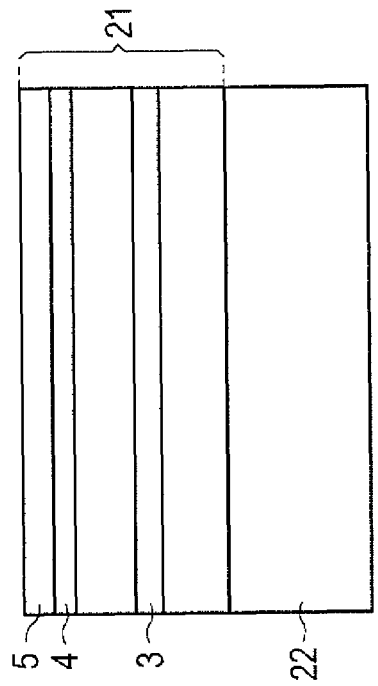
Figure 6D:
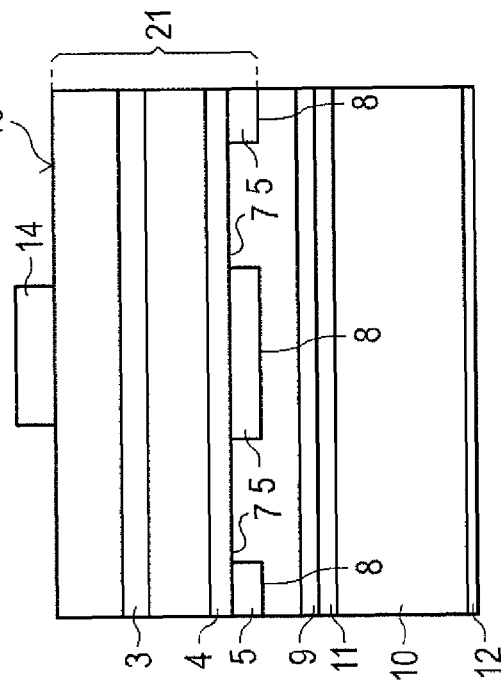

First of all, in both methods, a semiconductor layer sequence 21 is provided which comprises a connecting layer 4 and a barrier layer 5, FIGS. 5A and 6A. Furthermore, the semiconductor layer sequence has an active area 3 which is suitable for radiation production. The semiconductor layer sequence 21 is arranged on a substrate 22. The substrate 22 is preferably the growth substrate on which the semiconductor layer sequence 21 has been epitaxially grown, for example by means of MOVPE, with the connecting layer monolithically integrated in the semiconductor layer sequence and with the monolithically integrated barrier layer. The connecting layer 4 and the barrier layer 5 are preferably arranged on the side of the active area facing away from the substrate 22.

By way of example, GaAs is suitable as a growth substrate for a semiconductor layer sequence with an active area based on phosphide compound semiconductor material. The semiconductor layer sequence 21 is, in particular, intended to form a semiconductor body for the optoelectronic semiconductor chip.

The connecting layer 4 and the barrier layer 5 are designed such that they have different contact resistances, preferably predetermined contact resistances, in comparison to a predetermined material to be applied to the prefabricated semiconductor layer sequence or a predetermined material composition for a contact layer. The contact resistance from the contact layer to the barrier layer is in this case expediently greater than the contact resistance from the connecting layer to the predetermined contact layer.

According to FIG. 5A, the barrier layer 5 is arranged between the active area 3 and the connecting layer 4 while, in contrast, according to FIG. 6A, the connecting layer 4 is arranged between the active area 3 and the barrier layer 5.

Figure 5B:
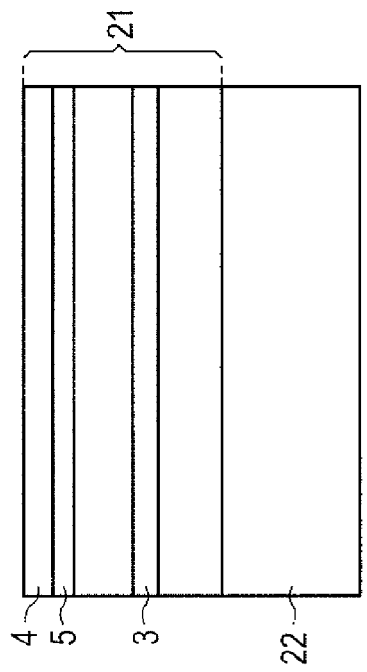

The connecting layer 4 is then removed in places, thus exposing the barrier layer 5 in order to form a barrier area to the contact layer, FIG. 5B, or the barrier layer 5 is removed in places such that the connecting layer 4 is exposed in order to form a connecting area to the contact layer, FIG. 6B. By way of example, an etching process using a suitably structured mask is suitable for the removal in places.

In this case, respectively predetermined areas of the connecting layer or of the barrier layer are removed. In the exemplary embodiment shown in FIGS. 5A to 5D, the areas of the connecting layer 4 are removed in which current injection into the semiconductor body of the chip is not desired in the finished semiconductor chip. In the method shown in FIGS. 6A to 6D, in contrast, the areas of the connecting area are exposed in which current injection is desired in the finished semiconductor chip. In particular, the barrier area and the connecting area for the semiconductor chip are defined just by means of this structure of the semiconductor layer sequence.

A contact layer 6 is then applied to the side of the semiconductor layer sequence 21 facing away from the substrate 22, which contact layer 6 is adjacent to the barrier layer 5 in the barrier area 8 and is adjacent to the connecting layer 4 in the connecting area 7. The contact layer 6 is electrically conductively connected to the active area via the connecting area 7 and radiation which is produced in the active area can pass through it. A TCO contact layer 6, in particular a ZnO contact layer, is in this case particularly suitable. The contact layer 6 can be deposited on the semiconductor layer sequence 21 by means of sputtering or PECVD, and in particular using a vacuum process.

Once the contact layer 6 has been applied, the layer assembly can also be sintered, with this preferably improving the electrical contact characteristics of the contact layer to the connecting layer 4. The layer assembly with the semiconductor layer sequence and the contact layer applied to it may, for example, be sintered for five minutes or longer, for example seven minutes, at a temperature of 450° C.

Since the contact layer 6 is essentially electrically not connected to the barrier layer but only to the connecting layer 4, the contact layer can be applied over the complete area to the semiconductor layer sequence. It is then possible to dispense with subsequent structuring or structured application of the contact layer, and it is nevertheless possible to achieve local current injection. It is also possible to dispense with a structured dielectric layer between the contact layer and the barrier area with openings for current to pass through for local current injection into the semiconductor layer sequence.

A mirror layer 9 is then applied to the side of the contact layer 6 facing away from the semiconductor layer sequence 21. The mirror layer is preferably metallic or is in the form of an alloy containing metal. The mirror layer can be deposited onto the layer assembly, for example by means of vapor deposition or sputtering, in particular using a vacuum process. By way of example, the mirror layer contains or is composed of Au or AuZn. The mirror layer can be deposited onto the layer assembly over the entire area.

Figure 5C:
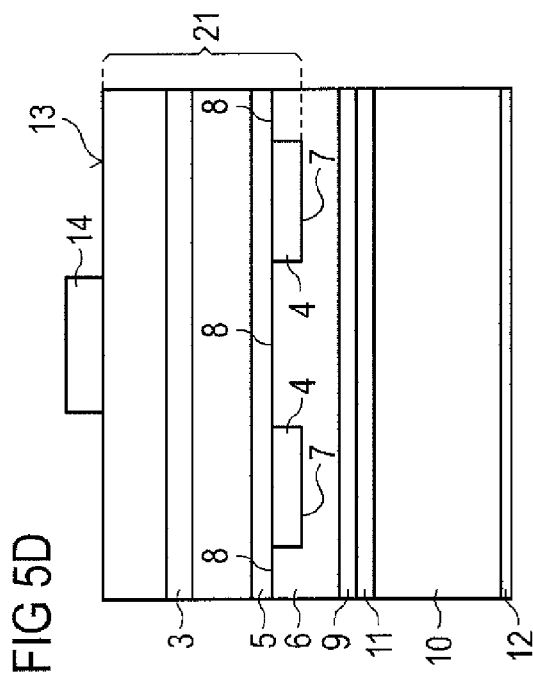
Figure 5D:
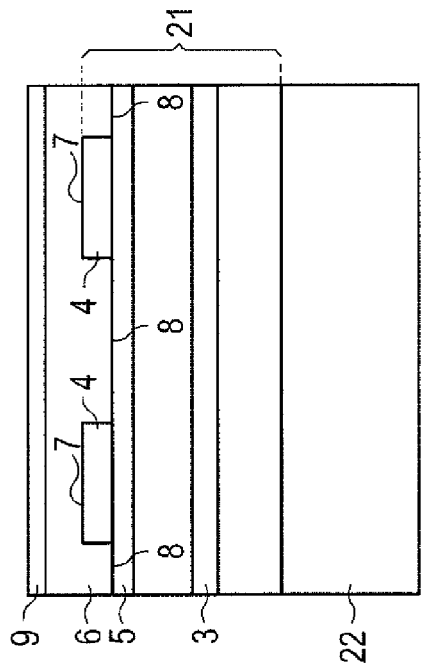
Figure 6C:
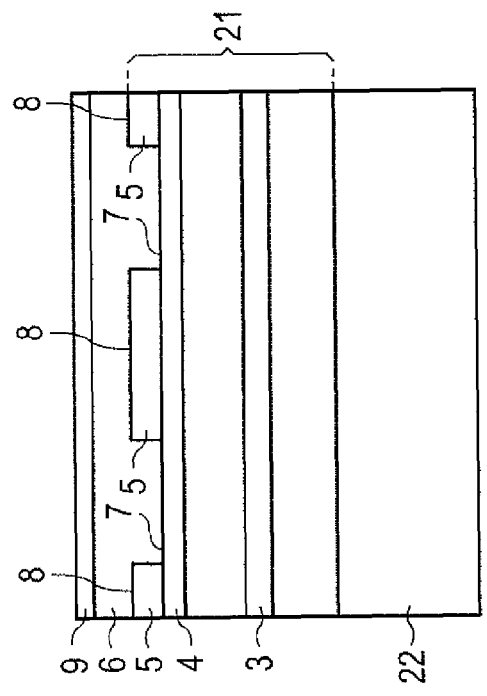

The structure resulting from this is illustrated schematically in FIGS. 5C and 6C, respectively. On account of the contact layer 6 being continuous, direct contact between the mirror layer 9 and the semiconductor material of the semiconductor layer sequence is prevented, thus reducing the alloy formation, which reduces the reflectivity, between the mirror layer and the semiconductor material.

The layer structure is then attached to a mount 10 by means of a connection layer 11 on the side of the mirror layer 9 facing away from the substrate. By way of example, the mount may contain Ge or GaAs. The connection layer 11 is preferably electrically conductive. The connection layer 11 may be in the form of a solder layer, an electrically conductive adhesive layer or a layer which is formed using a wafer-bonding process.

The substrate 22 is then removed at least in places (not illustrated) or completely from the semiconductor layer sequence 21, for example by means of etching or a laser removal process. In the process, at least an area of the upper face 13 of the semiconductor layer sequence 21 facing away from the contact layer 6 is preferably exposed, to which an electrode 14 may be applied, in particular deposited. The substrate 22 is, however, preferably removed completely. The physical height of the chip can thus be reduced.

A mounting electrode 12, for example a metallization, for mounting the semiconductor chip on an external electrical connecting conductor, is applied at a suitable time to the side of the contact layer 6 facing away from the semiconductor layer sequence 21, in particular to the side of the mount 10 facing away from the semiconductor layer sequence 21. The semiconductor chip 1 produced by means of the respective method, with a semiconductor body formed by the semiconductor layer sequence 21, is illustrated schematically in FIGS. 5D and 6D respectively.

The method may, of course, also be used for simultaneous production of a plurality of semiconductor chips in the wafer assembly, in which case the chips can be produced particularly easily and at low cost with a contact structure for local current injection. The contact layer can in this case be deposited on the whole wafer over the entire area with an electrical connection being made via connecting areas which are defined in the semiconductor layer sequence.

The scope of protection of the invention is not limited to the examples given hereinabove. The invention is embodied in each novel characteristic and each combination of characteristics, which particularly include every combination of any features which are stated in the claims, even if this feature or this combination of features is not explicitly stated in the claims or in the examples.

The invention claimed is:

1. An optoelectronic semiconductor chip, comprising:
   a semiconductor body including a semiconductor layer sequence and an active area which is suitable for radiation production; and
   a radiation-permeable and electrically conductive contact layer which is arranged on the semiconductor body and is electrically conductively connected to the active area, with the contact layer extending over a barrier layer in the semiconductor layer sequence and over a connecting layer in the semiconductor layer sequence, and with the contact layer being electrically conductively connected to the active area by a connecting area of the connecting layer;
   wherein the semiconductor body has a recess which breaks through the connecting layer and the barrier layer, with the contact layer extending into the recess.

2. The semiconductor chip as claimed in claim 1, wherein a further barrier layer is arranged between the active area and the contact layer.

3. The semiconductor chip as claimed in claim 1, wherein the contact layer at least one of adjoins the barrier layer in a barrier area and adjoins the connecting layer in the connecting area.

4. The semiconductor chip as claimed in claim 3, further comprising a plurality of barrier areas with one of these barrier areas covering an electrode of the semiconductor chip, which electrode is arranged on a side of the semiconductor body facing away from the barrier area, and with another barrier area being arranged in an edge area of the semiconductor chip.

5. The semiconductor chip as claimed in claim 4, wherein the barrier areas are continuous.

6. The semiconductor chip as claimed in claim 4, further comprising a plurality of separate connecting areas.

7. The semiconductor chip as claimed in claim 1, wherein an electrical contact resistance of the contact layer to the connecting layer is less than an electrical contact resistance of the contact layer to the barrier layer.

8. The semiconductor chip as claimed in claim 1, wherein a mirror layer containing metal is arranged on a side of the contact layer facing away from the active area.

9. The semiconductor chip as claimed in claim 1, wherein the semiconductor chip comprises a mount on which the semiconductor layer sequence is arranged, the contact layer is arranged between the semiconductor layer sequence and the mount, and the mount is different from a growth substrate of the semiconductor layer sequence.

10. The semiconductor chip as claimed in claim 1, wherein the contact layer contains a radiation-permeable and electrically conductive oxide.

11. The semiconductor chip as claimed in claim 1, wherein the contact layer contains zinc oxide.

12. The semiconductor chip as claimed in claim 1, wherein the connecting layer is based on an arsenide compound semiconductor material, and the barrier layer is based on a phosphide compound semiconductor material.

13. A method for producing a contact structure for an optoelectronic semiconductor chip comprising a semiconductor body including a semiconductor layer sequence and an active area which is suitable for radiation production; and a radiation-permeable and electrically conductive contact layer which is arranged on the semiconductor body and is electrically conductively connected to the active area, with the contact layer extending over a barrier layer in the semiconductor layer sequence and over a connecting layer in the semiconductor layer sequence, and with the contact layer being electrically conductively connected to the active area by a connecting area of the connecting layer; said semiconductor chip being configured to produce radiation, wherein the method comprises the steps of:
provide the semiconductor layer sequence with the connecting layer and the barrier layer, said barrier layer being arranged on the connecting layer;
removing the connecting layer from places in the semiconductor layer sequence-to expose the barrier layer, or removing the barrier layer from places in the semiconductor layer sequence to expose the connecting layer; and
applying the radiation-permeable and electrically conductive contact layer onto the semiconductor layer sequence, said contact layer being arranged both directly on the connecting layer and directly on the barrier layer;
providing a recess in the semiconductor body, where the recess breaks through the connecting layer and the barrier layer, and with the contact layer extending into the recess.

14. An optoelectronic semiconductor chip comprising:
a semiconductor body including a semiconductor layer sequence and an active area which is suitable for radiation production; and
a radiation-permeable and electrically conductive contact layer which is arranged on the semiconductor body and is electrically conductively connected to the active area, with the contact layer extending over a barrier layer in the semiconductor layer sequence and over a connecting layer in the semiconductor layer sequence, and with the contact layer being electrically conductively connected to the active area by a connecting area of the connecting layer;
wherein the semiconductor body has a recess which breaks through the connecting layer and the barrier layer, with the contact layer extending into the recess; and
wherein one of:
a) the barrier layer and the connecting layer have different conductance types;
b) the connecting layer and the barrier layer have the same conductance types, with a dopant concentration of the connecting layer being greater than a dopant concentration of the barrier layer; and
c) the connecting layer is doped and the barrier layer is undoped.

15. An optoelectronic semiconductor chip comprising:
a semiconductor body including a semiconductor layer sequence and an active area which is suitable for radiation production; and
a radiation-permeable and electrically conductive contact layer which is arranged on the semiconductor body and is electrically conductively connected to the active area, with the contact layer extending over a barrier layer in the semiconductor layer sequence and over a connecting layer in the semiconductor layer sequence, and with the contact layer being electrically conductively connected to the active area by a connecting area of the connecting layer; and
a further barrier layer arranged between the active area and the contact layer;
wherein one of:
a) the barrier layer and the connecting layer have different conductance types;
b) the connecting layer and the barrier layer have the same conductance types, with a dopant concentration of the connecting layer being greater than a dopant concentration of the barrier layer; and
c) the connecting layer is doped and the barrier layer is undoped.

16. A method for producing a contact structure for an optoelectronic semiconductor chip comprising a semiconductor body including a semiconductor layer sequence and an active area which is suitable for radiation production; and a radiation-permeable and electrically conductive contact layer which is arranged on the semiconductor body and is electrically conductively connected to the active area, with the contact layer extending over a barrier layer in the semiconductor layer sequence and over a connecting layer in the semiconductor layer sequence, and with the contact layer being electrically conductively connected to the active area by a connecting area of the connecting layer; said semiconductor chip being configured to produce radiation, wherein the method comprises the steps of:
providing the semiconductor layer sequence with the connecting layer and the barrier layer, said barrier layer being arranged on the connecting layer;
removing the barrier layer from places in the semiconductor layer sequence to expose the connecting layer; and
applying the radiation-permeable and electrically conductive contact layer onto the semiconductor layer sequence, said contact layer being arranged both directly on the connecting layer and directly on the barrier layer;
wherein one of: a) the barrier layer and the connecting layer have different conductance types, and b) the connecting layer is doped and the barrier layer is undoped.

* * * * *